United States Patent
Kanemaki et al.

(10) Patent No.: US 10,225,943 B2
(45) Date of Patent: *Mar. 5, 2019

(54) STRUCTURE, ELECTRONIC DEVICE INCLUDING THE SAME, AND METHOD OF MANUFACTURING STRUCTURE

(71) Applicant: KYOCERA CORPORATION, Kyoto (JP)

(72) Inventors: Yasuhito Kanemaki, Katano (JP); Akito Iwai, Osaka (JP); Kotaro Nakamura, Daito (JP); Shuhei Hisano, Machida (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/660,730

(22) Filed: Jul. 26, 2017

(65) Prior Publication Data
US 2017/0325348 A1    Nov. 9, 2017

Related U.S. Application Data

(63) Continuation of application No. PCT/JP2016/051908, filed on Jan. 22, 2016.

(30) Foreign Application Priority Data

Jan. 27, 2015 (JP) .................. 2015-013629

(51) Int. Cl.
*G06F 1/16* (2006.01)
*H05K 5/06* (2006.01)
(Continued)

(52) U.S. Cl.
CPC ........... *H05K 5/062* (2013.01); *G06F 1/1626* (2013.01); *G06F 1/1656* (2013.01);
(Continued)

(58) Field of Classification Search
CPC ......... H05K 5/062; H04M 1/02; G06F 1/1656
See application file for complete search history.

(56) References Cited

U.S. PATENT DOCUMENTS

2017/0322480 A1*  11/2017  Kanemaki .............. G03B 17/08

FOREIGN PATENT DOCUMENTS

JP      2013239879 A    11/2013
JP      2014003540 A     1/2014

OTHER PUBLICATIONS

International Search Report/Written Opinion dated Apr. 5, 2016 in corresponding International Application No. PCT/JP2016/051908, with Concise Explanation in English.
(Continued)

*Primary Examiner* — Adrian S Wilson
(74) *Attorney, Agent, or Firm* — Duane Morris LLP

(57) ABSTRACT

A structure includes a sheet metal antenna as a first member, a rear-surface-side housing as a second member including a through hole, and a sealing portion which seals the through hole. The second member includes a space. The sheet metal antenna includes an intermediate portion as a pass-through portion which passes through the space and the through hole. The space includes a first region, a second region located opposite to the first region with the intermediate portion being interposed, and a third region which lies from one main surface of the intermediate portion to the other main surface thereof while it is in contact with both of the first region and the second region, and the second member includes an injection path as a groove continuing to the first region.

9 Claims, 11 Drawing Sheets

(51) Int. Cl.
*H04M 1/02* (2006.01)
*H01Q 1/24* (2006.01)
*H01Q 1/42* (2006.01)
*H04M 1/18* (2006.01)

(52) U.S. Cl.
CPC ........... *G06F 1/1698* (2013.01); *H01Q 1/243* (2013.01); *H01Q 1/42* (2013.01); *H04M 1/02* (2013.01); *H04M 1/0202* (2013.01); *H04M 1/18* (2013.01)

(56) References Cited

OTHER PUBLICATIONS

International Search Report dated Apr. 5, 2016 in corresponding International Application No. PCT/JP2016/051907.

\* cited by examiner

STRUCTURE, ELECTRONIC DEVICE INCLUDING THE SAME, AND METHOD OF MANUFACTURING STRUCTURE

CROSS-REFERENCE TO RELATED APPLICATION

The present application is a continuation based on PCT Application No. PCT/JP2016/051908 filed on Jan. 22, 2016, which claims the benefit of Japanese Application No. 2015-013629 filed on Jan. 27, 2015. PCT Application No. PCT/JP2016/051908 is entitled "Structure, Electronic Device Provided with Same, and Method for Producing Structure," and Japanese Application No. 2015-013629 is entitled "Structure, Electronic Device Including the Same, and Method of Manufacturing Structure." The content of which is incorporated by reference herein in their entirety.

FIELD

An embodiment of the present disclosure relates to a structure, an electronic device including the same, and a method of manufacturing a structure.

BACKGROUND

Some electronic devices are required to be waterproof and to ensure communication performance through an antenna.

SUMMARY

A structure based on the present disclosure includes a first member, a second member including a first surface and a second surface which face opposite to each other and including a through hole, and a sealing portion which seals the through hole, with the first member passing through the through hole. The second member includes a space which opens into the second surface adjacently to the through hole on the side of the second surface. The first member includes a pass-through portion which passes through the space and the through hole. The space includes a first region, a second region located opposite to the first region with the pass-through portion being interposed, and a third region which lies from one main surface of the pass-through portion to the other main surface thereof while the third region is in contact with both of the first region and the second region. The second member includes a groove continuing to the first region.

The foregoing and other objects, features, aspects and advantages of the present disclosure will become more apparent from the following detailed description of the present disclosure when taken in conjunction with the accompanying drawings.

DETAILED DESCRIPTION

First Embodiment

An electronic device in a first embodiment will be described with reference to FIGS. 1 to 3. An electronic device 201 in the first embodiment includes a structure. The "structure" here will be described in any of embodiments below. The structure will be described in detail in a second embodiment or later.

Though description of electronic device 201 is given here with a smartphone being defined as the electronic device, the electronic device is not limited to the smartphone. A construction shown in the first embodiment is applicable to a wide variety of electronic devices as will be described later.

Figure 1:
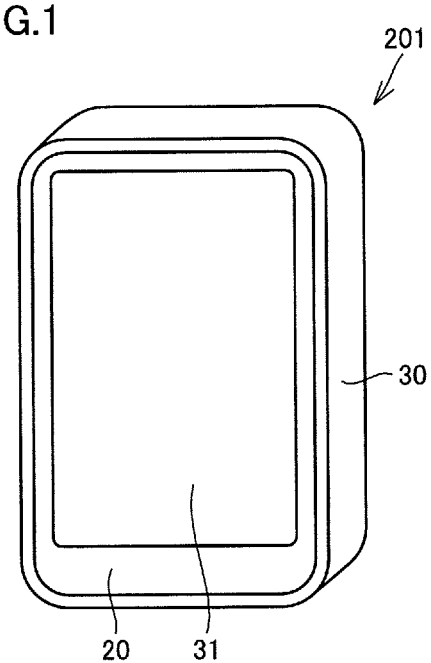
FIG. 1 is a first perspective view of an electronic device in a first embodiment.

In an example shown in FIG. 1, electronic device 201 includes a display 31 in a front surface. Electronic device 201 includes an exterior cover 30 so as to substantially cover a rear surface and side surfaces. In the example shown in FIG. 1, a housing 20 is seen in a portion of electronic device 201 not covered with exterior cover 30.

Figure 2:
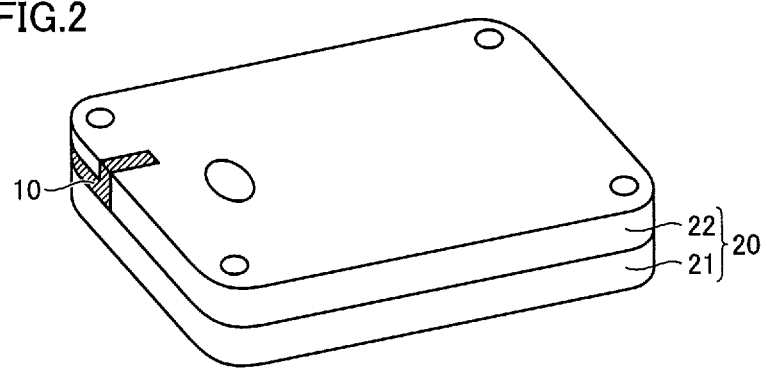
FIG. 2 is a second perspective view of the electronic device in the first embodiment.
Figure 3:
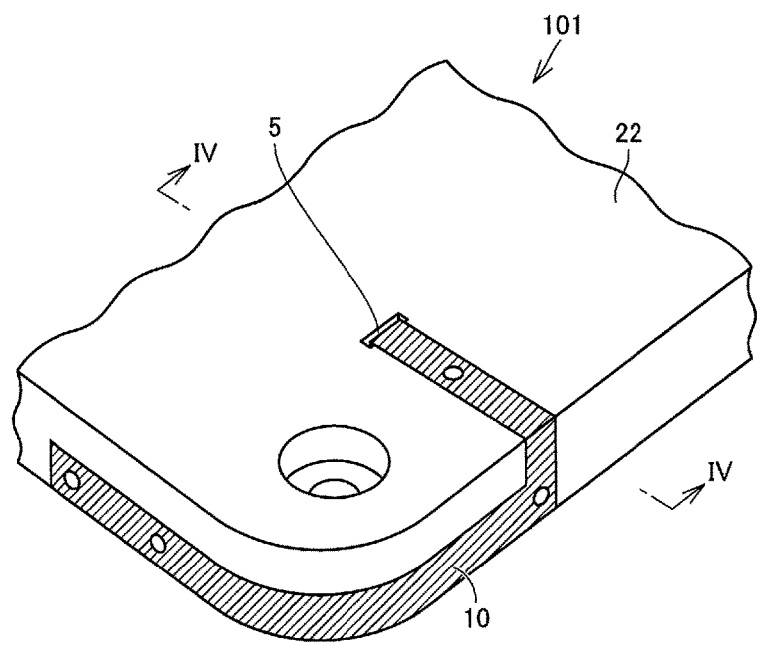
FIG. 3 is a partial perspective view of a structure in a second embodiment.

FIG. 2 shows a perspective view of a state that exterior cover 30 of electronic device 201 has been removed, with a side opposite to display 31, that is, a rear surface, facing upward. Housing 20 includes a front-surface-side housing 21 and a rear-surface-side housing 22. A sheet metal antenna 10 is located to cover a part of an outer surface of rearsurface-side housing 22. Sheet metal antenna 10 is hidden while exterior cover 30 is attached to housing 20.

Rear-surface-side housing 22 and sheet metal antenna 10 shown in FIG. 2 are some of components of the structure. The structure includes a first member and a second member. The first member includes sheet metal antenna 10. The second member includes rear-surface-side housing 22. FIG. 3 shows an enlarged view of a part of a portion corresponding to the structure, which is an extraction from the device shown in FIG. 2. FIG. 3 corresponds to an upper left portion in FIG. 2. FIG. 3 shows a view in a direction different from FIG. 2. Details of the structure are as set forth in the second embodiment or later.

Since the first embodiment includes the structure as described in embodiments which follow, a waterproof structure can readily be realized with a small number of parts. According to the first embodiment, a waterproof electronic device with a function to communicate through an antenna can be obtained. A structure for ensuring desired performance while achieving waterproofness can be realized with a small number of parts.

A shape of exterior cover 30 shown in FIG. 1 is merely by way of example and not limited thereto. A shape of exterior cover 30 may be varied as appropriate depending on a shape or arrangement of other parts. The electronic device in the first embodiment does not require exterior cover 30 and exterior cover 30 is optional.

Though rear-surface-side housing 22 corresponds to the second member in the first embodiment, front-surface-side housing 21 may correspond to the second member instead of rear-surface-side housing 22.

Though the term "electronic device" is used in the first embodiment, various devices are applicable as the electronic device. The electronic device may be, for example, a portable telephone, a portable information terminal, a tablet terminal, a personal computer, a game console, a television receiver, a portable music player, a CD player, a DVD player, an electronic dictionary, an electronic book reader, a digital camera, a video camera, a radio receiver, and a car navigation system. The concept of the portable telephone includes a smartphone.

Second Embodiment

Figure 4:
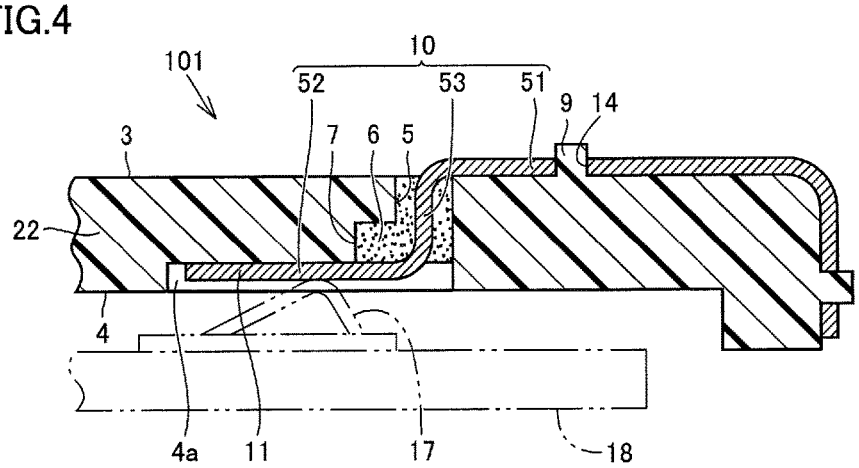
FIG. 4 is a cross-sectional view along the line IV-IV in FIG. 3.

A structure in the second embodiment will be described with reference to FIGS. 3 to 8. FIG. 4 is a cross-sectional view along the line IV-IV in FIG. 3.

The structure in the second embodiment includes an antenna structure. Though an antenna structure including a sheet metal antenna is described by way of example, the structure is not limited to that shown here.

A structure 101 in the second embodiment includes sheet metal antenna 10 as the first member, rear-surface-side housing 22 as the second member including a first surface 3 and a second surface 4 which face opposite to each other and including a through hole 5 which allows communication between a side of first surface 3 and a side of second surface 4, and a sealing portion 6 which seals through hole 5 while it fixes relative positional relation between sheet metal antenna 10 and rear-surface-side housing 22 with sheet metal antenna 10 passing through through hole 5. In rear-surface-side housing 22, first surface 3 is defined as an outer surface and second surface 4 is defined as an inner surface. Rear-surface-side housing 22 includes a space 7 which opens into second surface 4 adjacently to through hole 5 on the side of second surface 4. Sealing portion 6 includes a portion in space 7 in which a sealant is cured. Sheet metal antenna 10 is in a form of a band. Sheet metal antenna 10 includes a first portion 51 which extends on the side of first surface 3, a second portion 52 as an extension portion which extends along second surface 4 on a side of second surface 4, and an intermediate portion 53 as a pass-through portion which is interposed between first portion 51 and second portion 52 and passes through space 7 and through hole 5. Second portion 52 includes an antenna terminal 11.

Figure 5:
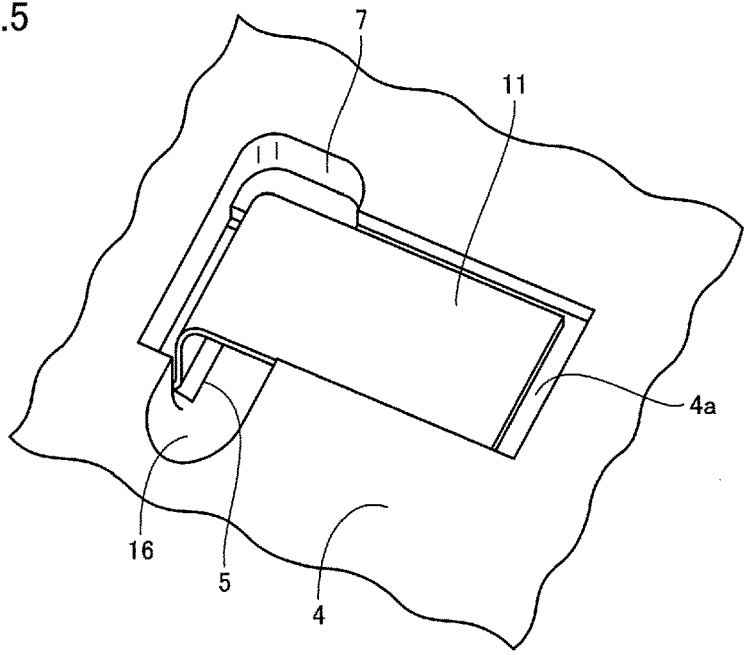
FIG. 5 is a perspective view of the structure in the second embodiment viewed from a side of a second surface.
Figure 6:
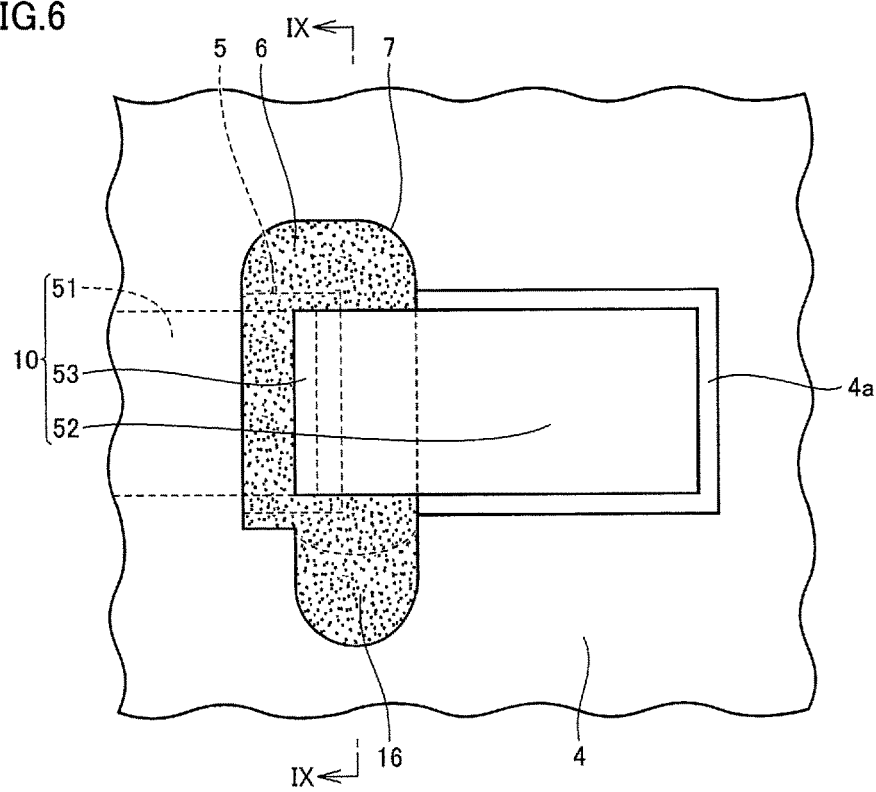
FIG. 6 is a plan view of the structure in the second embodiment viewed from the side of the second surface.
Figure 7:
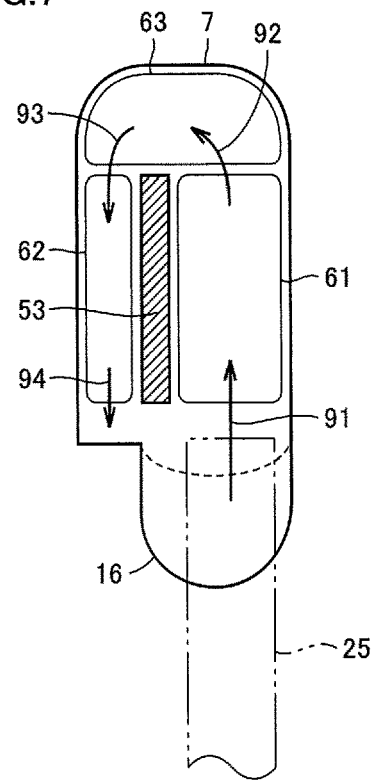
FIG. 7 illustrates an internal space in a space in the structure in the second embodiment.

FIG. 5 shows a perspective view of a portion in the vicinity of space 7 viewed from below in FIG. 4. FIG. 5 shows a state that sealing portion 6 has been removed for the sake of convenience of illustration. Space 7 may also be called a sealant chamber. FIG. 6 two-dimensionally shows space 7 filled with sealing portion 6. FIG. 7 shows details of an internal space in space 7.

As shown in FIG. 7, space 7 includes a first region 61, a second region 62 located opposite to first region 61 with intermediate portion 53 being interposed, and a third region 63 which lies from one main surface of intermediate portion 53 to the other main surface thereof while it is in contact with both of first region 61 and second region 62. Rear-surface-side housing 22 as the second member includes a groove continuing to first region 61. Rear-surface-side housing 22 includes an injection path 16 for injecting a sealant into first region 61 by way of example of the groove. For example, as shown with an arrow 91 in FIG. 7, the sealant injected into first region 61 through injection path 16 by a nozzle 25 moves from first region 61 to third region 63 as shown with an arrow 92, moves further to second region 62 as shown with an arrow 93, and finally collides with an inner wall in space 7 or merges with a portion in the vicinity of injection path 16 as shown with an arrow 94. The sealant thus surrounds intermediate portion 53. Sealing portion 6 is formed as shown in FIG. 6 as the sealant is thus cured while the sealant surrounds intermediate portion 53 of sheet metal antenna 10.

As shown in FIG. 4, a recess 4a may be located in second surface 4 of rear-surface-side housing 22. Sheet metal antenna 10 includes antenna terminal 11 for electrical connection to other components. In the second embodiment, antenna terminal 11 is accommodated in recess 4a. As shown in FIG. 4, a fixing hole 14 may be located in sheet metal antenna 10. In the example shown in FIG. 4, fixing hole 14 is located in first portion 51 of sheet metal antenna 10. In this case, sheet metal antenna 10 is fixed to rear-surface-side housing 22 as a pin 9 on rear-surface-side housing 22 is inserted in fixing hole 14.

Figure 8:
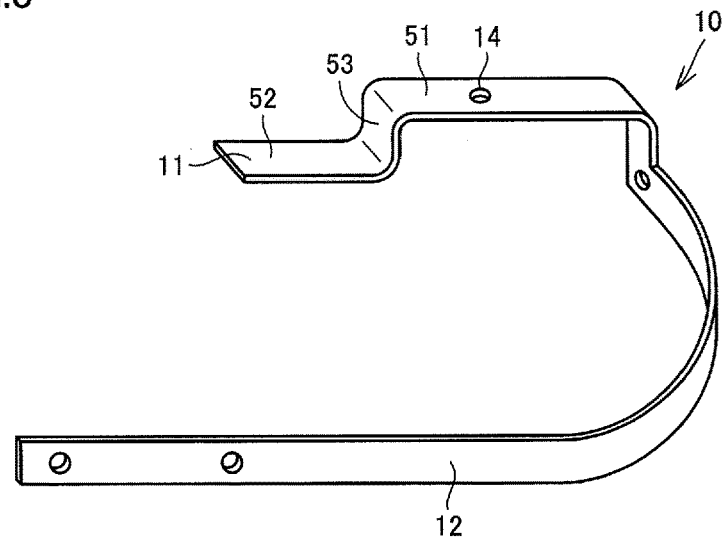
FIG. 8 is a perspective view of a sheet metal antenna as a first member included in the structure in the second embodiment.

FIG. 8 shows sheet metal antenna 10 as the first member extracted alone. Sheet metal antenna 10 is normally an integrally formed metal piece in a form of a band. Sheet metal antenna 10 includes first portion 51, second portion 52, and intermediate portion 53. A part or the entirety of second portion 52 serves as antenna terminal 11. Sheet metal antenna 10 includes an antenna main body 12 which extends on a side opposite to antenna terminal 11. Sheet metal antenna 10 is in such a structure as being bent midway. Sheet metal antenna 10 is exemplified merely by way of example of the first member, and the first member may be a member other than the sheet metal antenna. Even though the sheet metal antenna is employed as the first member, a shape or a size thereof is not limited to that shown here. What is shown in FIG. 8 is merely by way of example.

A spring contact terminal 17 placed on a wiring board 18 is relatively pressed against a surface of antenna terminal 11 as shown in FIG. 4, so that electrical connection is established. Though FIG. 4 shows wiring board 18 and spring contact terminal 17 with a chain double-dotted line, positions and shapes thereof are merely by way of example and not limited those as illustrated.

Since the through hole through which the sheet metal antenna passes is sealed with the sealing portion in the second embodiment, passage of water between the outside and the inside of the housing can be prevented. Therefore, a waterproof structure of the housing can be realized while a state that performance of the sheet metal antenna can be exhibited is maintained. Since two parts of a nut with an O ring and a screw are not necessary in the second embodiment as compared with a method using a combination of a nut with an O ring and a screw, the number of parts can be reduced. A waterproof structure can readily be realized with a small number of parts. A structure for ensuring desired performance while achieving waterproofness can be realized with a small number of parts.

Sealing portion 6 may include a portion filled with an adhesive. By adopting this feature, a sealing portion can readily be formed. Though the sealing portion may be formed by being partially filled with an adhesive, it may be formed by being totally filled with an adhesive. Some kind of resin may be employed for filling, instead of an adhesive.

In the second embodiment, since the second member includes injection path 16 for injecting a sealant into first region 61 which is a part of space 7, the sealant can accurately be injected into space 7. A state of injection of the sealant into space 7 can readily be stabilized. Characteristics of a finished product can thus be stabilized. When sheet metal antenna 10 is employed as the first member as exemplified here, antenna characteristics can be stabilized.

Sheet metal antenna 10 may include second portion 52 as an extension portion which extends along second surface 4 on the side of second surface 4 of rear-surface-side housing 22 and first region 61 may be covered with intermediate portion 53 and second portion 52. In this case, first region 61 is a region in space 7 which is hidden and difficult to see. In the second embodiment, however, the sealant can directly be injected into such first region 61 through injection path 16 so that the sealant can reliably be injected.

In the second embodiment, the sealant is injected through injection path 16 into first region 61 and the sealant flows into second region 62 after first region 61. Even though the sealant overflows space 7, second region 62 where such overflow may take place is located opposite to first region 61, that is, opposite to a portion of electrical connection such as antenna terminal 11. Therefore, adverse influence on electrical connection by overflow with the sealant can be avoided as much as possible.

Figure 9:
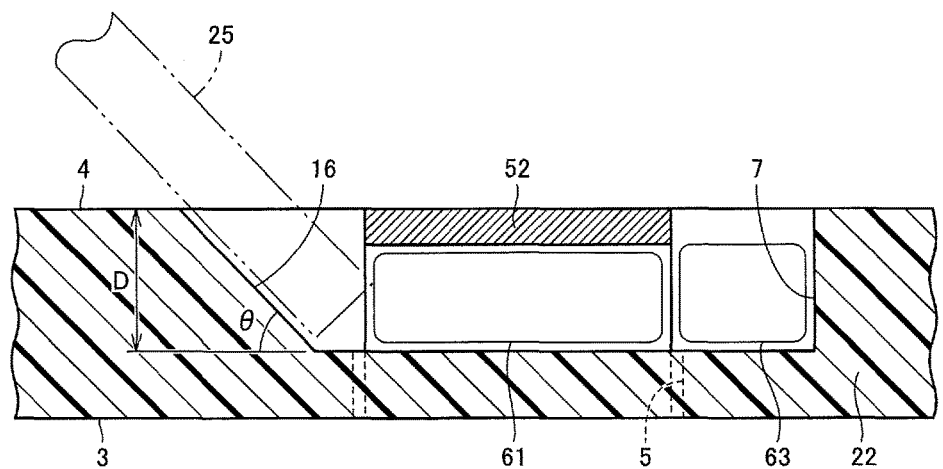
FIG. 9 is a cross-sectional view along the line IX-IX in FIG. 6.
Figure 10:
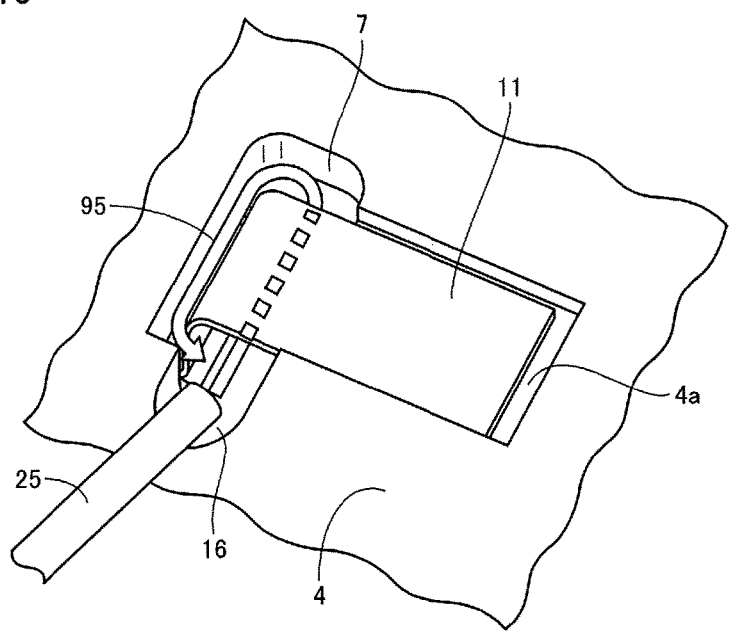
FIG. 10 illustrates injection of a sealant through a nozzle in order to obtain the structure in the second embodiment.

FIG. 9 shows a cross-sectional view along the line IX-IX in FIG. 6. FIG. 9 shows a state that sealing portion 6 has been removed for the sake of convenience of illustration. Injection path 16 as a groove continuing to first region 61 may include a shape for positioning of an instrument for injecting a sealant. The "instrument for injecting a sealant" includes, for example, a nozzle. The "instrument for injecting a sealant" may be, for example, a syringe. In the example shown in the second embodiment, injection path 16 is in a shape of a concavely curved surface as if a cylindrical shape were obliquely chipped away from rear-surface-side housing 22 defined as the second member. Therefore, the instrument for injecting a sealant can just be positioned by obliquely bringing closer a cylindrical portion of a tip end of the instrument. FIG. 9 shows nozzle 25 inserted in injection path 16. FIG. 10 shows injection of a sealant through nozzle 25.

As shown in FIG. 9, a portion of injection path 16 closest to first region 61 may be equal in depth D to first region 61 and a bottom portion of injection path 16 may be inclined to decrease in depth as a distance from first region 61 is greater. With such inclination, the instrument for injecting a sealant is readily applied. An angle of inclination θ of injection path 16 may be set to approximately 45°. With θ being set to approximately 45°, an injection operation can most efficiently be performed. θ may be set to 45°.

As shown in FIGS. 5 to 7, when viewed in a direction perpendicular to second surface 4, third region 63 may be rounded. With such a shape, a sealant injected into space 7 can smoothly move forward. The injected sealant should change its direction of movement when it goes around space 7, and in doing so, the sealant may change its direction with its strength of flow being lost as little as possible. Third region 63 corresponding to a point of turn-back of the flow of the sealant may be rounded. The "rounded shape" here may refer to a shape rounded in a plan view but not rounded in a cross-section as shown here. Without being limited as such, the rounded shape may refer to a shape rounded, for example, both in a plan view and in a cross-section.

Though sheet metal antenna 10 has been described as the first member, the first member is not limited to the sheet metal antenna but may be another member. The first member may include the sheet metal antenna because benefits of a waterproof structure can particularly noticeably be received by applying the structure in the second embodiment to the sheet metal antenna of the electronic device and peripherals thereof.

The second member may include a housing because benefits of a waterproof structure can particularly noticeably be received by applying the structure described above to the housing of the electronic device and peripherals thereof.

A plurality of structures can also be constructed in one housing. One electronic device may include a plurality of structures. Here, a plurality of structures different in construction may together be present in one electronic device.

The electronic device in the first embodiment is an electronic device including any structure described in the second embodiment. Alternatively, the electronic device in the first embodiment may be an electronic device including a structure in any embodiment which will be described later. Since the electronic device in the first embodiment includes any structure described above, it can be an electronic device achieving desired performance with ensured waterproofness.

Third Embodiment

Figure 11:
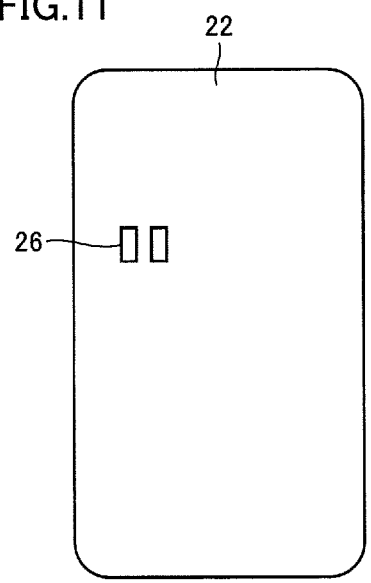
FIG. 11 is a plan view of a structure in a third embodiment.
Figure 12:
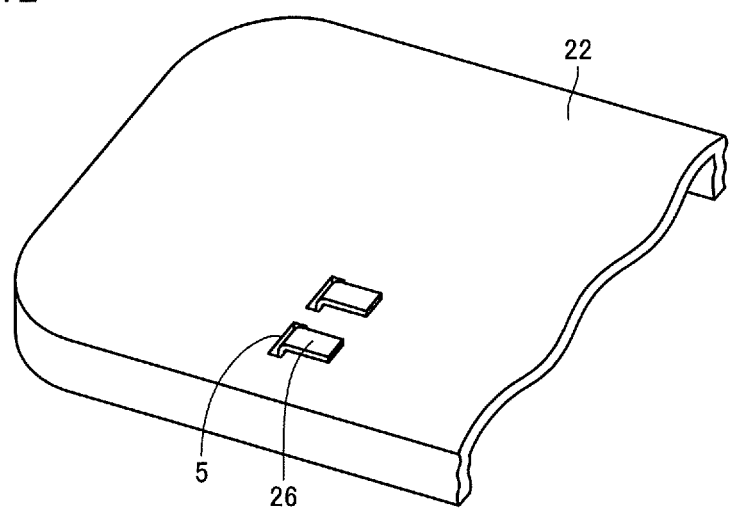
FIG. 12 is a partial perspective view of the structure in the third embodiment.

A structure in a third embodiment will be described with reference to FIGS. 11 and 12. In the third embodiment, a member other than the sheet metal antenna is employed as the first member. A power feed terminal 26 is employed as the first member as shown in FIGS. 11 and 12. Two power feed terminals 26 are located as one pair in one rear-surface-side housing 22. Individual power feed terminal 26 is a conductor in a form of a band. Power feed terminal 26 is located to pass through through hole 5 in rear-surface-side housing 22 as the second member. The structure as described in the second embodiment can be applied also to such power feed terminal 26.

As shown in the third embodiment, power feed terminal 26 may be employed as the first member and rear-surface-side housing 22 may be employed as the second member. The third embodiment is the same as the second embodiment in that first surface 3 is defined as the outer surface of the housing and second surface 4 is defined as the inner surface of the housing. A portion of power feed terminal 26 as the first member seen in FIGS. 11 and 12 corresponds to first portion 51 in the second embodiment.

In the third embodiment, a structure for ensuring performance for power feed while achieving waterproofness can be realized with a small number of parts.

Fourth Embodiment

Figure 13:
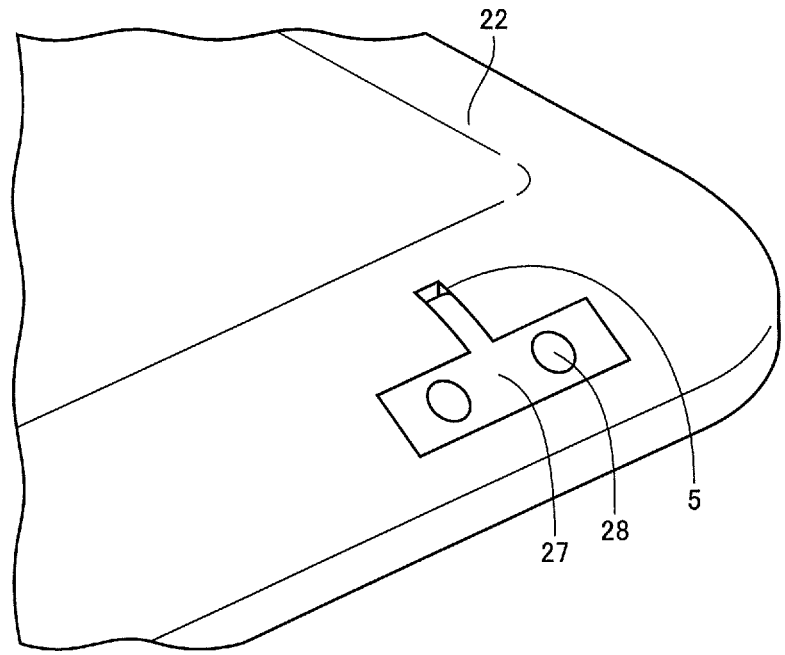
FIG. 13 is a partial perspective view of a structure in a fourth embodiment viewed from a first side.
Figure 14:
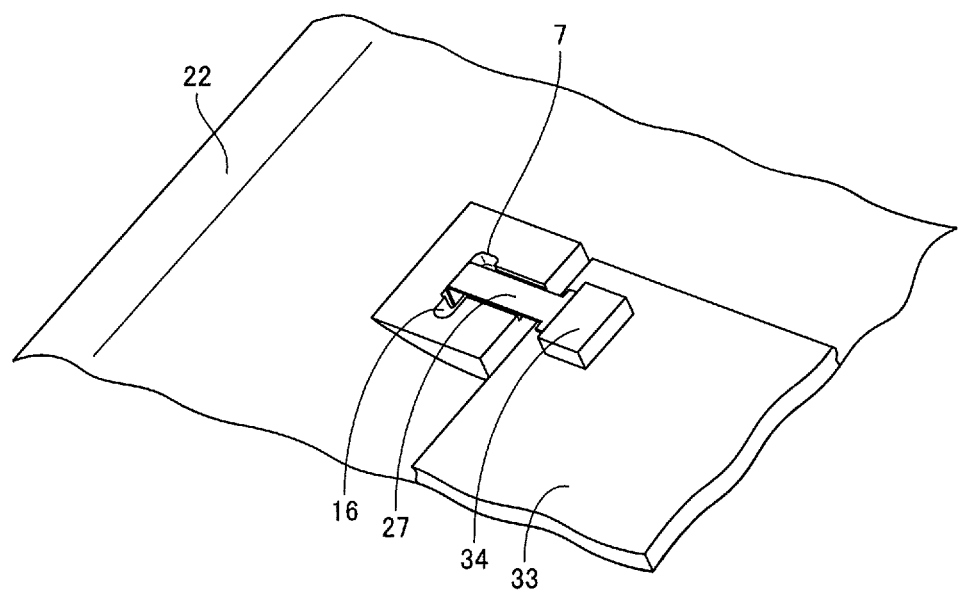
FIG. 14 is a partial perspective view of the structure in the fourth embodiment viewed from a second side.

A structure in a fourth embodiment will be described with reference to FIGS. 13 and 14. In the fourth embodiment, a flexible substrate (FPC) 27 is employed as the first member as shown in FIGS. 13 and 14. In the example shown in FIG. 13, flexible substrate 27 is what is called a key FPC and includes two keys 28. Flexible substrate 27 is located to pass through through hole 5 in rear-surface-side housing 22 as the second member. FIG. 14 shows rear-surface-side housing 22 viewed from a rear side. A substrate 33 is located and a connector 34 is located on a surface of substrate 33. One end of flexible substrate 27 which passes through through hole 5 is connected to connector 34 through space 7. Though the sealing portion in space 7 is not shown for the sake of convenience of illustration in the example shown in FIG. 14, actually, space 7 is filled with a sealant and the sealant is cured to serve as the sealing portion. The structure as described in the second embodiment can be applied also to such flexible substrate 27.

In the fourth embodiment, flexible substrate 27 may be employed as the first member and rear-surface-side housing 22 may be employed as the second member. The fourth embodiment is the same as the second embodiment in that first surface 3 is defined as the outer surface of the housing and second surface 4 is defined as the inner surface of the housing. A portion of flexible substrate 27 as the first member seen in FIG. 13 corresponds to first portion 51 in the second embodiment. A portion of flexible substrate 27 as the first member seen in FIG. 14 corresponds to second portion 52 in the second embodiment.

Though an example in which flexible substrate 27 is a key FPC has been shown here, the structure can similarly be applied also to a flexible substrate of another type.

In the fourth embodiment, a structure for ensuring performance for installation of keys while achieving waterproofness can be realized with a small number of parts.

In the fourth embodiment, front-surface-side housing 21 may be employed as the second member, instead of rear-surface-side housing 22.

Fifth Embodiment

Figure 15:
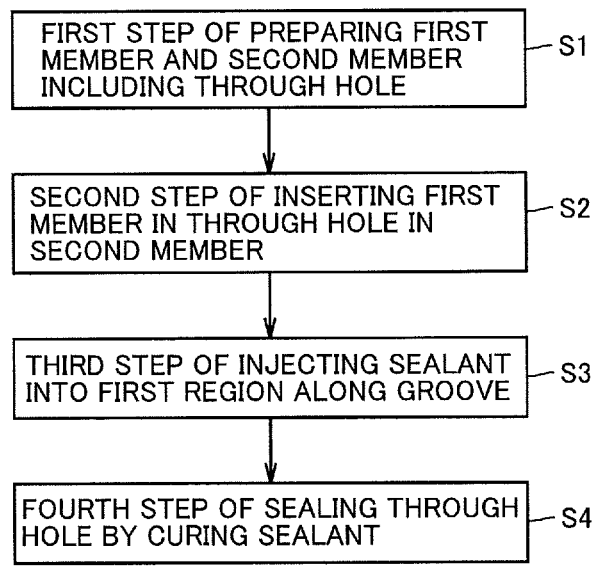
FIG. 15 is an exemplary flowchart of a method of manufacturing a structure in a fifth embodiment.
Figure 16:
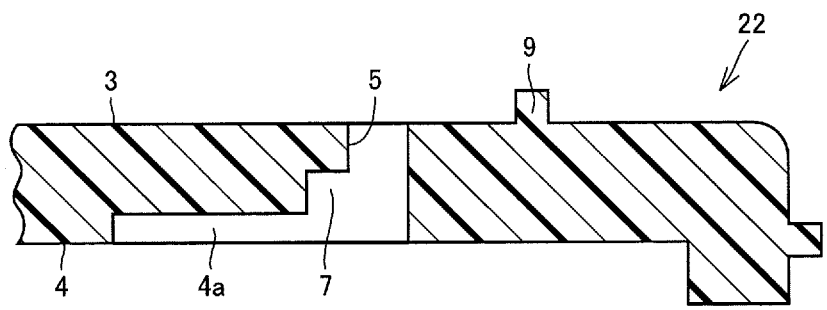
FIG. 16 is a cross-sectional view of a rear-surface-side housing as a second member prepared in a first step of the method of manufacturing a structure in the fifth embodiment.
Figure 17:
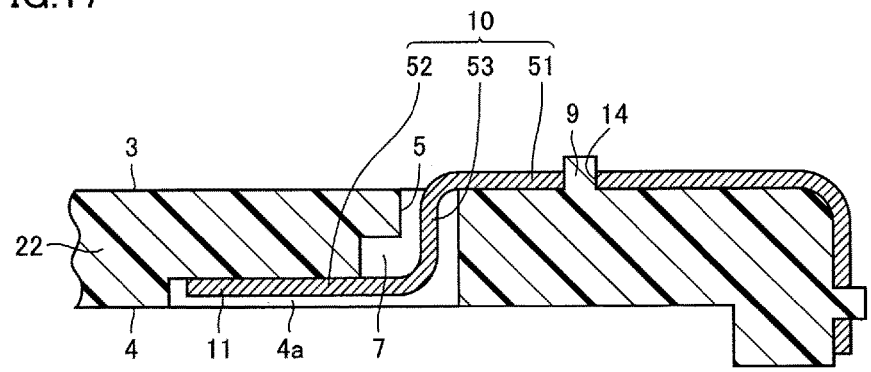
FIG. 17 is a cross-sectional view of a structure after a second step in the method of manufacturing a structure in the fifth embodiment is performed.

A method of manufacturing a structure in a fifth embodiment will be described with reference to FIGS. 15 to 17. FIG. 15 shows an exemplary flowchart of the method of manufacturing a structure in the fifth embodiment. A method of manufacturing the structure described in the second embodiment will be described here by way of example.

The method of manufacturing a structure in the fifth embodiment includes a first step S1 of preparing a first member and a second member, the second member including a first surface and a second surface which face opposite to each other and including a through hole which allows communication between a side of the first surface and a side of the second surface, a second step S2 of inserting the first member in the through hole, a third step S3 of injecting a sealant into a portion including the through hole after second step S2, and a fourth step S4 of sealing the through hole while the first member and the second member are fixed relatively to each other by curing the sealant injected in third step S3. The second member includes a space which opens into the second surface adjacently to the through hole on the side of the second surface. The first member includes a pass-through portion which passes through the space and the through hole. The space includes a first region hidden by the pass-through portion and the second portion, a second region located opposite to the first region with the pass-through portion being interposed, and a third region which lies from one main surface of the pass-through portion to the other main surface thereof while it is in contact with both of the first region and the second region. The second member includes a groove which continues to the first region. In third step S3, the sealant is injected into the first region along the groove by applying a tip end of an instrument for injecting the sealant to the groove. In third step S3, the sealant injected into the first region is located to surround the pass-through portion by moving from the first region via the third region to the second region.

Each step will specifically be described. In first step S1, for example, sheet metal antenna 10 as the first member as shown in FIG. 8 and rear-surface-side housing 22 as the second member as shown in FIG. 16 are prepared. Rear-surface-side housing 22 includes injection path 16 as a groove which continues to first region 61. Injection path 16 can be used for injecting a sealant.

In second step S2, sheet metal antenna 10 as the first member is inserted in through hole 5 in the second member. Consequently, a structure as shown in FIG. 17 is obtained.

Third step S3 performed subsequently to the above is as shown in FIGS. 7, 9, and 10. A sealant is injected into a portion including the through hole. The "portion including the through hole" here refers, for example, to a portion which is combination of through hole 5 and space 7. Injection can be carried out, for example, by using nozzle 25. The sealant is injected into first region 61 along injection path 16, for example, by applying the tip end of nozzle 25 to injection path 16 in the second member.

In fourth step S4, through hole 5 is sealed while the first member and the second member are fixed relatively to each other by curing the sealant injected in third step S3. Third step S3 and fourth step S4 may be performed concurrently.

According to the method of manufacturing a structure in the fifth embodiment, a structure allowing realization of a structure for ensuring desired performance while achieving waterproofness with a small number of parts can be obtained. In the fifth embodiment, since the sealant is injected into first region 61 along injection path 16 by using the second member including injection path 16 and applying the tip end of the instrument for injecting the sealant to injection path 16 in third step S3, the sealant can accurately be injected. A state of injection of the sealant can readily be stabilized.

Sixth Embodiment

Figure 18:
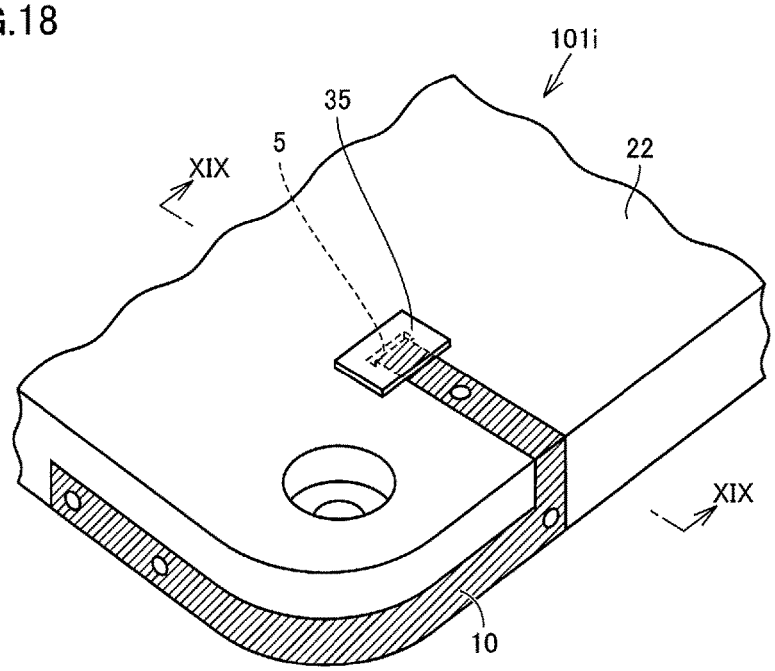
FIG. 18 is a partial perspective view of a structure in a sixth embodiment.
Figure 19:
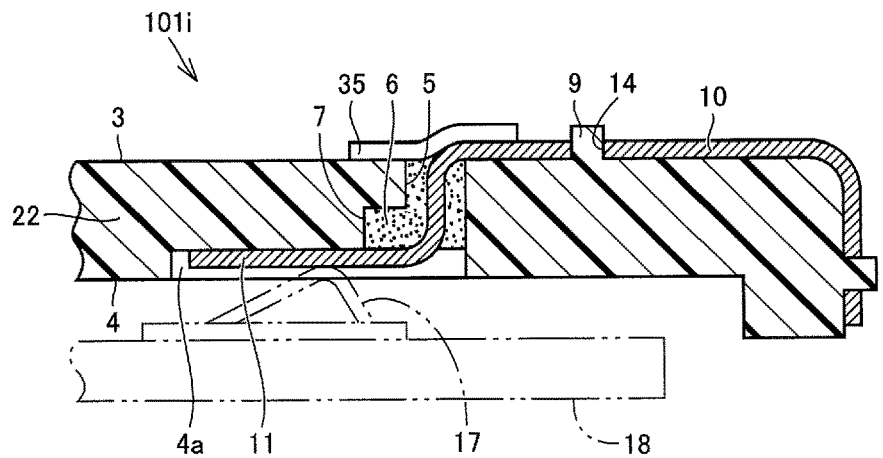
FIG. 19 is a cross-sectional view along the line XIX-XIX in FIG. 18.

A structure in a sixth embodiment will be described with reference to FIGS. 18 to 19. FIG. 18 shows a structure 101i in the sixth embodiment. FIG. 19 shows a cross-sectional view along the line XIX-XIX in FIG. 18. Structure 101i is similar in basic construction to that described in the second embodiment, however, it is different from the second embodiment in the following.

In structure 101i, a sheet 35 is stuck to close through hole 5. Sheet 35 is stuck to lie across first surface 3 as an outer surface of rear-surface-side housing 22 and a surface of sheet metal antenna 10. Sheet 35 may be stuck, for example, by adhesion. A material for sheet 35 is not particularly limited and the sheet may be composed, for example, of polycarbonate. Sheet 35 has a thickness, for example, of 0.15 mm.

In assembling structure 101*i*, for example, sheet metal antenna 10 is inserted in through hole 5 in rear-surface-side housing 22, thereafter sheet 35 is stuck to close an outer end of through hole 5, and a surface to which sheet 35 is stuck is set to face down in this state. Then, through injection path 16 which opens upward in this state, a sealant should only be injected into space 7.

An effect the same as in the second embodiment can be achieved also in the sixth embodiment. Since sheet 35 serves as the bottom and prevents displacement or drop of the sealant downward under the gravity in the sixth embodiment, the sealant before curing is more likely to remain in through hole 5 and space 7. Solidification of the sealant with the sealant being located at an appropriate position is facilitated. After the sealant is solidified, sealing portion 6 is hidden by sheet 35 when rear-surface-side housing 22 is viewed from the outer side, that is, from above in FIG. 19. Therefore, a user can be prevented from touching sealing portion 6. Sheet 35 serves to protect sealing portion 6.

Seventh Embodiment

Figure 20:
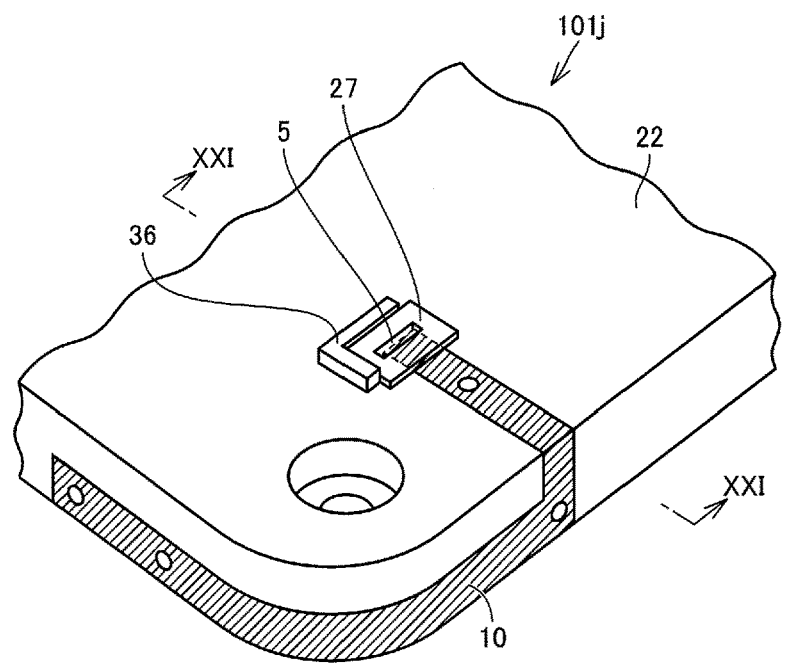
FIG. 20 is a partial perspective view of a structure in a seventh embodiment.
Figure 21:
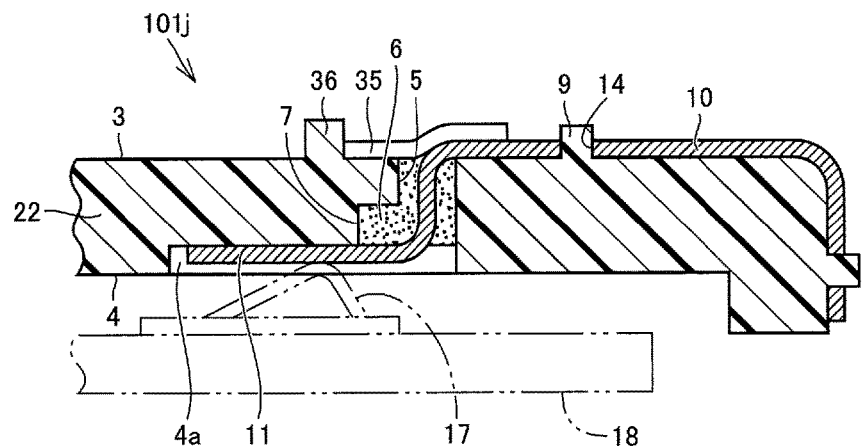
FIG. 21 is a cross-sectional view along the line XXI-XXI in FIG. 20.

A structure in a seventh embodiment will be described with reference to FIGS. 20 to 21. FIG. 20 shows a structure 101*j* in the seventh embodiment. FIG. 21 shows a cross-sectional view along the line XXI-XXI in FIG. 20. Structure 101*j* is similar in basic construction to that described in the sixth embodiment, however, it is different from the sixth embodiment in the following.

In structure 101*j*, a projection portion 36 for positioning of sheet 35 is located in the vicinity of through hole 5. In the example shown in FIGS. 20 and 21, projection portion 36 is formed from a protrusion like a wall and it is in an L-shape when viewed two-dimensionally. In sticking sheet 35, sheet 35 is positioned by laterally pressing an end of sheet 35 against projection portion 36. Projection portion 36 is a part of rear-surface-side housing 22. Projection portion 36 may be formed integrally with other portions of rear-surface-side housing 22. Though an example in which projection portion 36 is in an L-shape has been shown here, the projection portion is not necessarily in an L-shape. Projection portion 36 is not limited to a projection portion in a shape of one continuous L, but two sides perpendicular to each other may be disposed at an interval from each other. Projection portion 36 may be formed, for example, from a plurality of protrusions in a form of pins. Sheet 35 may be positioned by laterally pressing sheet 35 against these protrusions in a form of pins.

Eighth Embodiment

Figure 22:
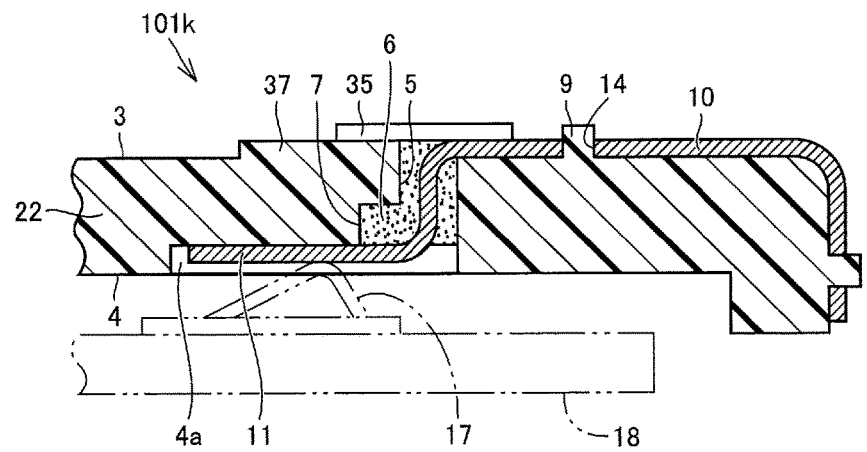
FIG. 22 is a cross-sectional view of a structure in an eighth embodiment.

A structure in an eighth embodiment will be described with reference to FIG. 22. FIG. 22 shows a structure 101*k* in the eighth embodiment. Structure 101*k* is similar in basic construction to that described in the sixth embodiment, however, it is different from the sixth embodiment in the following.

Though a height difference has been located midway in sheet 35 in the example shown in FIGS. 19 and 21, such a height difference does not have to be located. In structure 101*k* in the eighth embodiment, as shown in FIG. 22, a shored-up portion 37 is located in a part in the vicinity of through hole 5 in first surface 3 as an upper surface of rear-surface-side housing 22. Shored-up portion 37 refers to a portion increased in height like a platform. An upper surface of shored-up portion 37 is flat. In the example shown in FIG. 22, a height of shored-up portion 37 is substantially the same as a thickness of sheet metal antenna 10. By adopting this construction, sheet 35 can be stuck while sheet 35 is not substantially bent but maintains a flat state. Since load applied to sheet 35 can be lower by sticking the sheet in such a flat state, reliability of sheet 35 increases. Shored-up portion 37 should only be located in a region around through hole 5 where sheet 35 is layered. Though projection portion 36 is not shown in the example shown in FIG. 22, projection portion 36 and shored-up portion 37 may both be employed. For example, on an upper surface of shored-up portion 37, a projection portion 36 for positioning may be located to further protrude.

Some of embodiments may be adopted as being combined as appropriate.

Though embodiments of the present disclosure have been described, it should be understood that embodiments disclosed herein are illustrative and non-restrictive in every respect. The scope of the present disclosure is defined by the terms of the claims and is intended to include any modifications within the scope and meaning equivalent to the terms of the claims.

The invention claimed is:

1. A structure comprising:
   a first member;
   a second member including a first surface and a second surface which face opposite to each other and including a through hole; and
   a sealing portion which seals the through hole, with the first member passing through the through hole,
   the second member including a space which opens into the second surface adjacently to the through hole on the side of the second surface,
   the first member including a pass-through portion which passes through the space and the through hole,
   the space including
      a first region,
      a second region located opposite to the first region with the pass-through portion being interposed, and
      a third region which lies from one main surface of the pass-through portion to the other main surface of the pass-through portion while the third region is in contact with both of the first region and the second region, and
   the second member including a groove continuing to the first region.

2. The structure according to claim 1, wherein
   the sealing portion includes a sealant in the space and the groove includes a shape for positioning of an instrument for injecting the sealant.

3. The structure according to claim 1, wherein
   a portion of the groove closest to the first region is as deep as the first region and a bottom portion of the groove is inclined to decrease in depth as a distance from the first region is greater.

4. The structure according to claim 1, wherein
   the third region is in a rounded shape when viewed in a direction perpendicular to the second surface.

5. The structure according to claim 1, wherein
   the first member includes a sheet metal antenna.

6. The structure according to claim 1, wherein
   the second member includes a housing.

7. The structure according to claim 1, wherein
   the first member includes an extension portion which extends along the second surface on the side of the second surface of the second member and the first region is covered with the pass-through portion and the extension portion.

8. An electronic device comprising the structure according to claim 1.

9. A method of manufacturing a structure comprising:
a first step of preparing a first member and a second member, the second member including a first surface and a second surface which face opposite to each other and including a through hole;
a second step of inserting the first member in the through hole;
a third step of injecting a sealant into a portion including the through hole after the second step; and
a fourth step of sealing the through hole while the first member and the second member are fixed relatively to each other by curing the sealant injected in the third step,
the second member including a space which opens into the second surface adjacently to the through hole on the side of the second surface,
the first member including a pass-through portion which passes through the space and the through hole,
the space including
a first region hidden by the pass-through portion and a portion which extends along the second surface on a side of the second surface of the first member,
a second region located opposite to the first region with the pass-through portion being interposed, and
a third region which lies from one main surface of the pass-through portion to the other main surface of the pass-through portion while the third region is in contact with both of the first region and the second region,
the second member including a groove continuing to the first region,
in the third step, the sealant being injected into the first region along the groove by applying a tip end of an instrument for injecting the sealant to the groove, and
in the third step, the sealant injected into the first region being located to surround the pass-through portion as the sealant moves from the first region via the third region to the second region.

* * * * *